United States Patent
Endo et al.

(10) Patent No.: US 8,436,616 B2
(45) Date of Patent: May 7, 2013

(54) SAMPLE TUBE AND MEASUREMENT METHOD FOR SOLID-STATE NMR

(75) Inventors: Yuki Endo, Tokyo (JP); Katsuya Hioka, Tokyo (JP); Kazuo Yamauchi, Aichi (JP)

(73) Assignee: Jeol Ltd., Tokyo (JP)

(*) Notice: Subject to any disclaimer, the term of this patent is extended or adjusted under 35 U.S.C. 154(b) by 369 days.

(21) Appl. No.: 12/849,998

(22) Filed: Aug. 4, 2010

(65) Prior Publication Data
US 2011/0241674 A1 Oct. 6, 2011

(30) Foreign Application Priority Data

Apr. 2, 2010 (JP) ................................. 2010-085798
Jul. 29, 2010 (JP) ................................. 2010-170116

(51) Int. Cl.
*G01R 33/20* (2006.01)
*G01V 3/00* (2006.01)

(52) U.S. Cl.
USPC .......................................... 324/321; 324/318

(58) Field of Classification Search .......... 324/300–322; 600/407–435; 382/128–131
See application file for complete search history.

(56) References Cited

U.S. PATENT DOCUMENTS

| | | | | |
|---|---|---|---|---|
| 6,538,444 B2* | 3/2003 | Gerald et al. | ................. | 324/318 |
| 6,653,832 B2* | 11/2003 | Wind et al. | .................... | 324/307 |
| 6,670,811 B2* | 12/2003 | Wind et al. | .................... | 324/307 |
| 6,836,115 B2* | 12/2004 | Wind et al. | .................... | 324/307 |
| 7,081,753 B2* | 7/2006 | Mullen et al. | ................. | 324/318 |
| 7,151,374 B2* | 12/2006 | Doty | .............................. | 324/321 |
| 7,498,812 B2* | 3/2009 | Doty | .............................. | 324/318 |
| 2003/0020474 A1* | 1/2003 | Gerald et al. | ................. | 324/318 |
| 2006/0017438 A1* | 1/2006 | Mullen et al. | ................. | 324/318 |
| 2008/0136413 A1* | 6/2008 | Doty | .............................. | 324/321 |
| 2011/0241674 A1* | 10/2011 | Endo et al. | .................... | 324/309 |

FOREIGN PATENT DOCUMENTS

| | | |
|---|---|---|
| JP | 2001141800 A | 5/2001 |
| JP | 2003177172 A | 6/2003 |
| JP | 2009092424 A | 4/2009 |

OTHER PUBLICATIONS

P.K. Madhu et al., "Multiple-Pulse and Magic-Angle Spinning Aided Double-Quantum Proton Solid-State NMR Spectroscopy", Chemical Physics Letters, vol. 394, (2004), pp. 423-428.

* cited by examiner

*Primary Examiner* — Melissa Koval
*Assistant Examiner* — Tiffany Fetzner
(74) *Attorney, Agent, or Firm* — The Webb Law Firm (57) ABSTRACT

A solid-state NMR sample tube and method of using same which can be spun stably and at high speed while suppressing its bending resonance. A solid sample to be investigated by solid-state NMR spectroscopy can be sealed in the sample tube. The sample tube includes a hollow cylinder having opposite ends. At least one of the ends is open. The sample tube has a length L, an outside diameter D, and an inside diameter d which satisfy a given relationship disclosed herein.

7 Claims, 6 Drawing Sheets

| # | ELEMENT |
|---|---|
| 1 | PROBE |
| 2 | SAMPLE TUBE |
| 3 | SPINNER STATOR |
| 4 | MOVABLE MECHANISM |
| 5 | SHIFT |
| 6 | KNOB |

| # | ELEMENT |
|---|---|
| B1 | SAMPLE TUBE |
| B2 | RADIAL GAS BEARING |

SAMPLE TUBE AND MEASUREMENT METHOD FOR SOLID-STATE NMR

BACKGROUND OF THE INVENTION

1. Field of the Invention

The present invention relates to a sample tube used to measure nuclear magnetic resonance (NMR) spectra of solid samples. The invention also relates to a method of solid-state NMR measurements using this sample tube.

2. Description of Related Art

An NMR (nuclear magnetic resonance) spectrometer is an analytical instrument for detecting signals from atomic nuclei having spin magnetic moments by applying a static magnetic field to the atomic nuclei, producing a Larmor precession on the spin magnetic moments, and applying an RF radiation having the same frequency as the precession to induce a resonance.

Samples to be investigated by NMR include two types: solution samples and solid samples. Many solution samples give quite sharp NMR spectra and, therefore, it is widespread to perform molecular structural analysis of chemical substances by utilizing the excellent performance of the obtained high-resolution NMR spectra.

On the other hand, in an NMR spectrum of a sample in solid phase, interactions (such as dipolar interactions) which would be nullified by rotational Brownian motion in a solution manifest themselves directly and so the spectral line width broadens extremely, thus, obscuring chemical shift terms. Therefore, in such an NMR spectrum, it is impossible to isolate the signal peaks arising from various portions of a molecule under investigation. As a result, it has been thought that solid-state NMR spectroscopy is unsuited for molecular structure analysis.

A method which overcomes this undesired phenomenon and gives rise to sharp solid-state NMR spectra was discovered by E. R. Andrew in 1958. In particular, anisotropic interactions are removed and chemical shift terms can be extracted by tilting the sample tube at an angle of 54.7° to the direction of the static magnetic field $B_0$ and spinning the tube at high speed. This method is known as MAS (magic angle spinning).

A solid-state NMR instrument includes a mechanism for adjusting the angle of the axis of rotation of a sample tube. The mechanism is shown in the block diagram of FIG. 1. The instrument has a probe 1. The sample tube 2 holds a sample therein. The tube 2 is inserted in a spinner stator 3 and spun at high speed using a gaseous medium such as compressed air or nitrogen gas.

Figure 1:
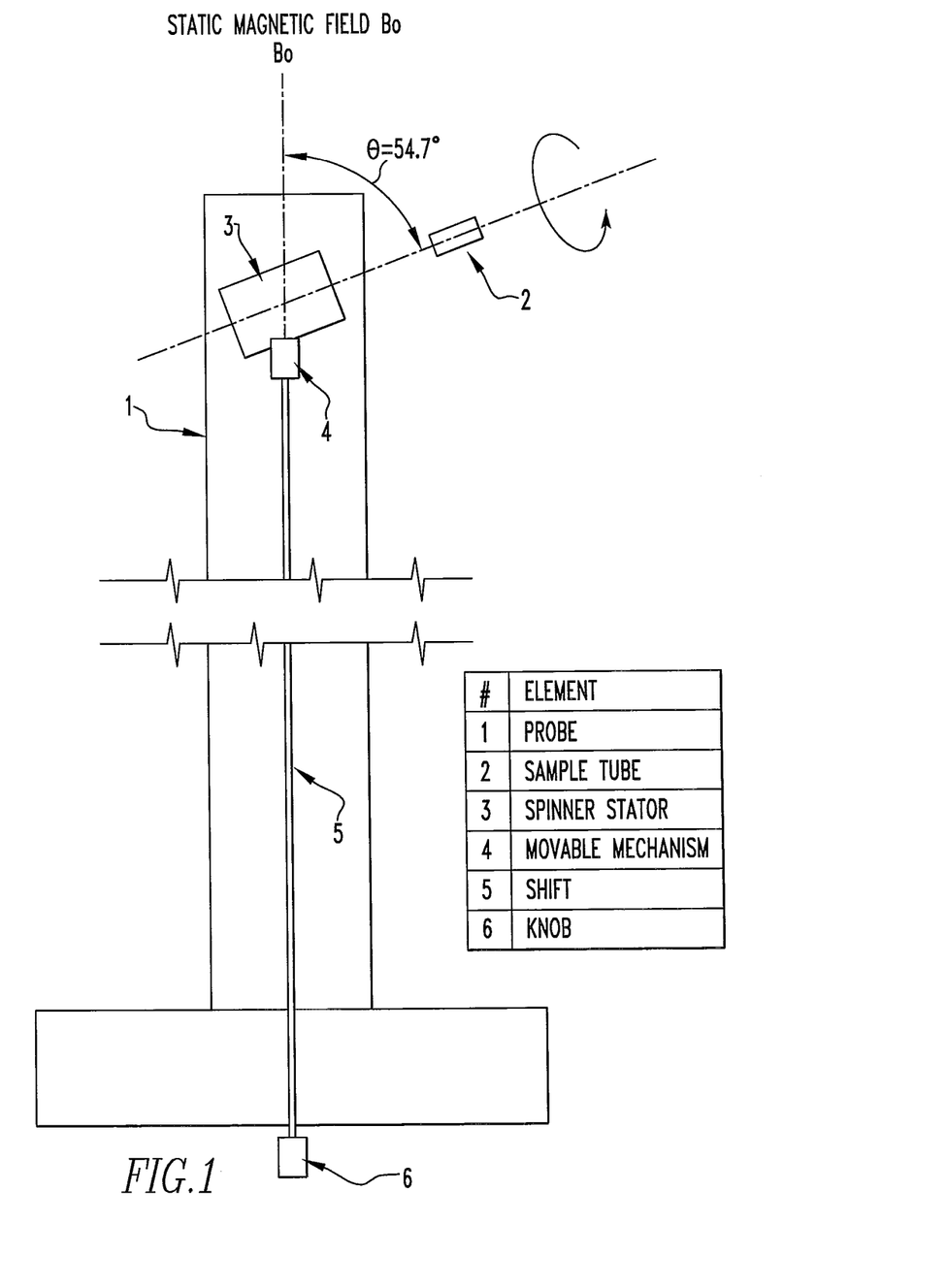
FIG. 1 is a diagram illustrating an existing method of performing solid-state NMR spectral measurements.

A movable mechanism 4 such as a toothed wheel is used to vary the angle of the spinner stator 3. A shaft 5 or the like is connected to the movable mechanism 4 to permit the movable mechanism 4 to be controlled from outside. A knob 6 that is connected with the shaft 5 is accessed and manipulated by a user when the magic angle is actually adjusted.

Chemical shift anisotropy can be eliminated and the NMR spectral line width can be sharpened by spinning the sample tube at the magic angle of 54.7° to the static magnetic field $B_0$. Therefore, adjustment of the magic angle is an important technique.

Generally, in order to investigate solid samples by MAS NMR, the sample must be spun at a high speed from a few kHz to tens of kHz within a static magnetic field. Accordingly, to obtain such rotational speeds, gas bearing techniques have been heretofore used, and various methods have been proposed.

Figure 2:
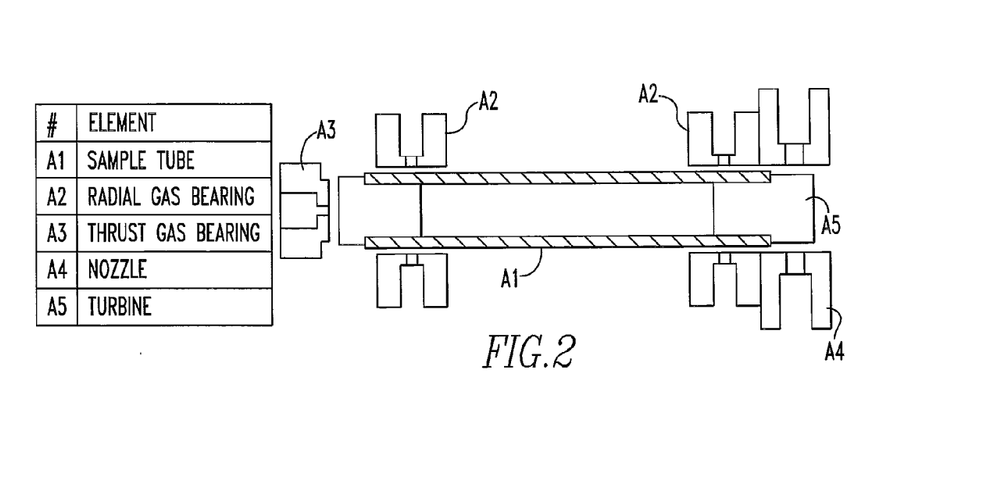
FIG. 2 is a schematic representation of a solid-state NMR tube and its surroundings.

FIG. 2 shows one example of the positional relationship between a sample tube A1 for holding a solid sample to be spun at high speed, radial gas bearings A2 supporting the tube A1, and a thrust gas bearing A3 acting to determine the position of the tube A1 in the thrust direction. The sample tube A1 is floated by feeding air into the radial gas bearings A2 and thrust gas bearing A3 and is kept out of contact with the surroundings. The sample tube A1 is spun at high speed by ejecting an air jet at a turbine A5 from a nozzle A4.

Figure 3:
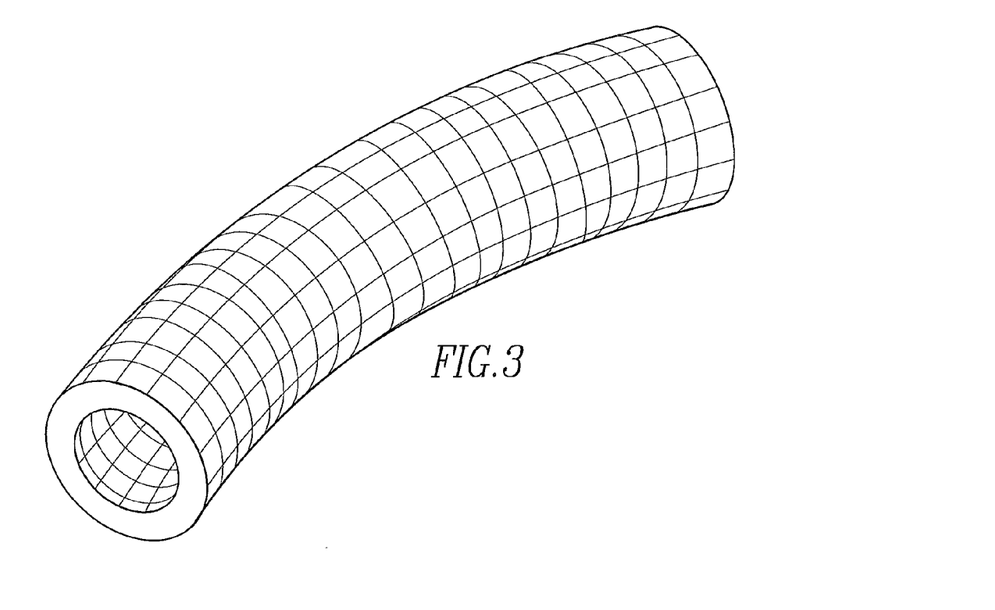
FIG. 3 is a schematic diagram illustrating a bending resonance of a sample tube induced when it is spun at high speed.
Figure 4:
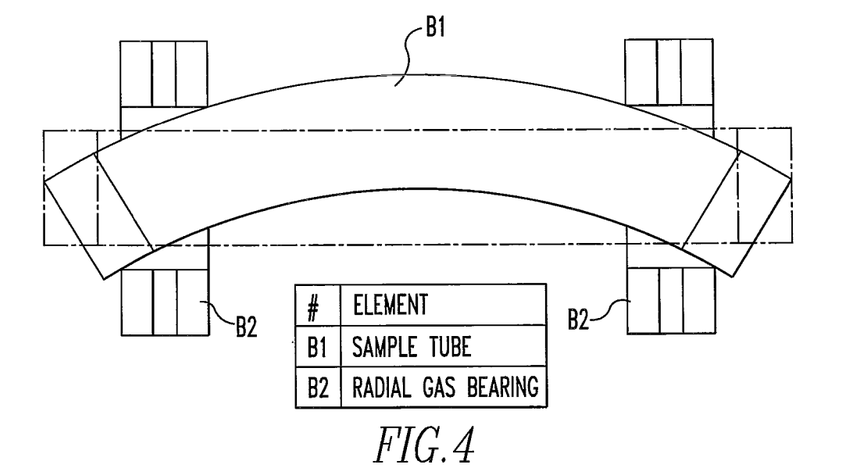
FIG. 4 is a schematic side elevation illustrating a bending resonance of a sample tube when it is spun at high speed.

FIGS. 3 and 4 schematically illustrate a bending resonance of a sample tube B1 when it is spun at high speed. The natural frequency of the bending resonance of the tube B1 becomes lower as the diameter of the sample tube B1 decreases (e.g., where the diameter is less than 1 mm).

Therefore, if the rotational speed of the sample tube B1 is increased, the natural frequency of bending mode of the sample tube B1 is approached. The sample tube B1 comes into a bending resonance at some rotational frequency. As a result, as shown in FIG. 4, the sample tube B1 in a bending resonance comes into contact with radial gas bearings B2, thus creating the problem that the rotational speed of the sample tube B1 is restricted.

Generally, high-speed rotation of a sample tube is effectively achieved by lowering the peripheral speed of the sample tube when it is rotating so as to lessen the effects of the viscosity of the gas. One means conventionally adopted for this purpose is to reduce the outside diameter of the sample tube.

However, sufficient consideration has not been given to the material and length of the sample tube and, therefore, the target rotational speed of the sample tube approaches or exceeds the natural frequency of bending mode, resulting in instability of the rotation of the tube or its fracture. Consequently, high-speed rotation corresponding to the diameter of the sample tube has not been accomplished.

SUMMARY OF THE INVENTION

In view of the foregoing, it is an object of the present invention to provide a sample tube for use with a solid-state NMR spectrometer and which permits stable and high-speed rotation of the sample tube while suppressing bending resonance of the tube. It is another object of the present invention to provide a solid-state NMR measurement method using this sample tube.

To achieve the first-mentioned object, the present invention provides a sample tube in which a sample investigated by solid-state NMR spectroscopy can be sealed. Gas bearings are formed by supplying a gas into spaces between the sample tube and a tube-holding mechanism that holds the sample tube. The gas bearings permit the sample tube to be spun at high speed. The sample tube includes a hollow cylinder having opposite ends at least one of which is open to form an opening. A cover is mounted in the opening. The length L, outside diameter D, and inside diameter d of the sample tube satisfy the relationship:

$$(L/D) < \lambda \cdot \left(\frac{1}{8c}\right)^{1/2} \cdot \left(\left(1 + \left(\frac{d}{D}\right)^2\right) \cdot \frac{E}{\rho}\right)^{1/4} \cdot B^{1/2} \qquad (1)$$

where E is the longitudinal elastic modulus, $\rho$ is the density, $\lambda$, is 4.730, c is the sonic velocity (340 m/s), and B is a factor which is dependent on the ratio L/D and which is a value interpolated or extrapolated from each point in the following table.

TABLE 1

| (L/D) | 3 | 4 | 5 | 6 | 7 | 8 | 10 | 20 |
|---|---|---|---|---|---|---|---|---|
| B | 0.77 | 0.84 | 0.89 | 0.91 | 0.93 | 0.95 | 0.97 | 0.99 |

In one feature of the present invention, the value of the ratio L/D is 3 or more.

In another feature of the invention, the longitudinal elastic modulus E of the hollow cylinder is between 190 GPa and 230 GPa and the density ρ is between 5,500 kg/m³ and 6,200 kg/m³. Alternatively, the longitudinal elastic modulus E of the hollow cylinder is between 280 GPa and 320 GPa and the density ρ is between 2,900 kg/m³ and 3,500 kg/m³.

In a further feature of the invention, the outside diameter D of the hollow cylinder is between 0.3 mm and 1.1 mm.

In an additional feature of the invention, the ratio d/D of the inside diameter d of the hollow cylinder to the outside diameter D is between 0.25 and 0.6.

In a still further feature of the invention, the cover mounted in the opening of the hollow cylinder is not in excess of the hollow cylinder in outside diameter.

A solid-state NMR measurement method associated with the present invention performs solid-state NMR spectral measurements using the above-described solid-state NMR sample tube.

The solid-state NMR sample tube of the present invention can seal a sample investigated by solid-state NMR spectroscopy. The gas bearings are formed by supplying a gas into gaps between the sample tube and the tube-holding mechanism. The gas bearings permit the sample tube to be spun at high speed. The sample tube includes the hollow cylinder having opposite ends. At least one of the ends is open and forms an opening. The cover is mounted in the opening. The length L, outside diameter D, and inside diameter d of the sample tube satisfy the relationship already described. Thus, a solid-state NMR sample tube is offered which permits the sample tube to be stably spun at high speed while suppressing bending resonance of the sample tube.

The solid-state NMR measurement method associated with the present invention makes it possible to perform solid-state NMR spectral measurements using the solid-state NMR sample tube in such a way that the sample tube can be stably spun at high speed while suppressing bending resonance of the tube.

Other features and advantages of the present invention will become apparent from the following more detailed description, taken in conjunction with the accompanying drawings, which illustrate, by way of example, the principles of the invention.

DETAILED DESCRIPTION OF THE INVENTION

The preferred embodiments of the present invention are hereinafter described with reference with the accompanying drawings. According to "Handbook of Mechanical Engineering, Fundamental Edition A", published by the Japan Society of Mechanical Engineering in 1987, pp. A3-50 to A3-53, the natural vibrational frequency of a bending resonance of an elongated sample tube is given by $$f = \frac{\lambda^2}{2\pi L^2} \sqrt{\frac{EI}{A\rho}} \quad (3)$$

where L is the length, E is the longitudinal elastic modulus, I is the geometrical moment of inertia, A is the cross-sectional area, ρ is the density, and λ is the vibrational frequency factor (4.730 when the vibration is of the first order, 7.853 when the vibration is of the second order, and 10.996 when the vibration is of the third order).

According to the above-cited "Handbook of Mechanical Engineering, Fundamental Edition A", p. A4-25, in a case where the sample tube is a cylinder having an outside diameter of D and an inside diameter of d, we have $$A = \frac{\pi}{4}(D^2 - d^2), \ I = \frac{\pi}{64}(D^4 - d^4) \quad (4)$$

Substituting these equations into Eq. (3) results in $$f = \frac{\lambda^2}{2\pi L^2} \sqrt{\frac{(D^2 + d^2)}{16} \cdot \frac{E}{\rho}} \cdot B = \frac{1}{2\pi D} \cdot \frac{\lambda^2}{4} \cdot \frac{1}{\left(\frac{L}{D}\right)^2} \cdot \sqrt{\left(1 + \left(\frac{d}{D}\right)^2\right) \cdot \frac{E}{\rho}} \cdot B \quad (5)$$

where B is a corrective coefficient depending on the ratio L/D, is found by a numerical analysis, and is a value interpolated or extrapolated from each point in the following table.

TABLE 2

| (L/D) | 3 | 4 | 5 | 6 | 7 | 8 | 10 | 20 |
|---|---|---|---|---|---|---|---|---|
| B | 0.77 | 0.84 | 0.89 | 0.91 | 0.93 | 0.95 | 0.97 | 0.99 |

The state in which the peripheral speed at the surface of the sample tube does not exceed the sonic velocity gives an indication of a practical rotational speed of the sample tube used with gas bearings. Let c be the sonic velocity. The rotational speed equivalent to the sonic velocity is given by $$f_c = \frac{c}{\pi D} \quad (6)$$

Therefore, in order to permit stable high-speed rotation while preventing fracture due to bending resonance, it is necessary to satisfy the relationship:

$$f > f_c \quad (7)$$

That is, we obtain $$\frac{1}{2\pi D} \cdot \frac{\lambda^2}{4} \cdot \frac{1}{\left(\frac{L}{D}\right)^2} \cdot \sqrt{\left(1+\left(\frac{d}{D}\right)^2\right) \cdot \frac{E}{\rho}} \cdot B > \frac{c}{\pi D} \quad (8)$$

$$(L/D)^2 < \frac{\lambda^2}{8c} \cdot \sqrt{\left(1+\left(\frac{d}{D}\right)^2\right) \cdot \frac{E}{\rho}} \cdot B$$

$$(L/D) < \lambda \cdot \left(\frac{1}{8c}\right)^{1/2} \cdot \left(\left(1+\left(\frac{d}{D}\right)^2\right) \cdot \frac{E}{\rho}\right)^{1/4} \cdot B^{1/2}$$

where $\lambda = 4.730$.

It can be seen from this result that in order to achieve stable high-speed rotation, the length L of the sample tube is restricted by the outside diameter D of the sample tube, inside diameter d, longitudinal elastic modulus E, density $\rho$, and sonic velocity c. The length L of the sample tube can be determined by determining the outside diameter D of the sample tube, inside diameter d, longitudinal elastic modulus E, and density $\rho$ taking account of the above-described considerations. Specific preferred examples of the length L of the sample tube are as follows.

TABLE 3

| longitudinal elastic modulus (GPa) | density (kg/m³) | D (mm) | d (mm) | c (m/s) | L (mm) |
|---|---|---|---|---|---|
| 200 | 6,000 | 1 | 0.5 | 340 | <6.9 |
| 300 | 3,000 | 1 | 0.5 | 340 | <9.1 |

Fundamentally, it is desired that the outside diameter D of the cylindrical portion be 1.1 mm or less and that the ratio d/D of the inside diameter d to the outside diameter D be 0.6 or less.

It is said, however, that with the present machining technology, the wall thickness of the sample tube can be reduced to 0.2 mm at best. If the machining technology will be improved in the future, the limit of the wall thickness achieved would be 0.1 mm. If the inside diameter decreases, the sample space decreases. This is disadvantageous to the sensitivity with which NMR measurements are made. It is more difficult to insert and withdraw a sample. Accordingly, one combination of dimensions consists of outside diameter D=0.3 mm and inside diameter d=0.1 mm. Another combination consists of outside diameter D=0.4 mm and inside diameter d=0.1 mm. Therefore, the lower limit of the outside diameter D is about 0.3 mm. The lower limit of the ratio d/D is about 0.25.

With respect to the value of the ratio L/D, an NMR detector is generally so constructed that there are two gas bearings supporting a sample tube and that a detection coil is inserted between them. Accordingly, the lower limit of the length L of the sample tube would be the sum of the lengths of the two gas bearings and the length of the detection coil. It is said that in designing a gas bearing, the length of the bearing needs to be roughly equal to the diameter of the bearing in order to obtain stable performance. Furthermore, it is said that the length of the detection coil needs to be nearly equal to its diameter in order to secure both a good uniformity of the RF magnetic field and a high efficiency. The sum of the lengths is three times the diameter D. The practical limit of the sample tube is about three times the diameter, i.e., L/D≧3.

Figure 5:
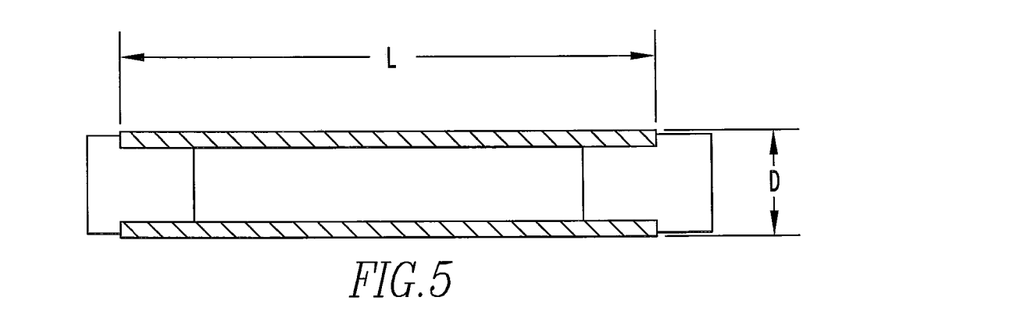
FIG. 5 is a cross-sectional view of a solid-state NMR sample tube associated with the present invention.
Figure 6:
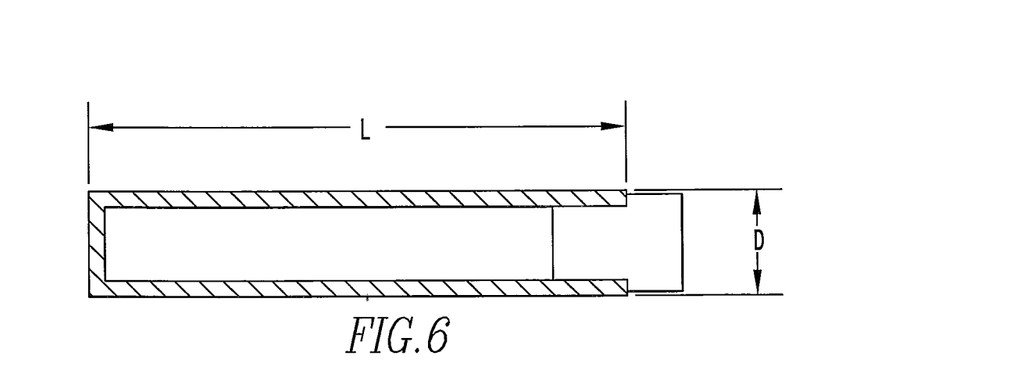
FIG. 6 is a cross-sectional view of a further solid-state NMR sample tube associated with the present invention.

Sample tubes adopting the length L shown in Table 2 are schematically shown in FIGS. 5 and 6. FIG. 5 shows a sample tube made of a cylindrical ceramic tube whose opposite ends are open. Covers are mounted with a press fit in the openings at the opposite ends, thus sealing a solid sample in the sample tube. FIG. 6 shows a sample tube made of a cylindrical bottomed tube of ceramic whose one end is closed. A cover is mounted with a press fit in the opening at the opposite end. A solid sample can be sealed in the tube.

Such sample tubes are adapted to be made from ceramics such as zirconia and silicon nitride. Zirconia and silicon nitride have their respective features and so it is desired to use them separately according to the intended purpose of the sample tube.

Various zirconia materials have various physical properties. It is desired to use zirconia materials having longitudinal elastic moduli E between 190 GPa and 230 GPa and densities $\rho$ between 5,500 kg/m³ and 6,200 kg/m³.

First, zirconia is excellent in that it is inexpensive. Also, it is easy to machine. Therefore, zirconia is adapted for miniaturization of sample tubes. When an NMR measurement is performed, a background signal arising from zirconium appears. However, measurements of samples containing zirconium in practice are rarely performed. Consequently, sample tubes made from zirconia can be used for a very large number of samples. Hence, zirconia sample tubes have great versatility.

Various silicon nitride materials have various physical properties. It is desired to use silicon nitride materials having longitudinal elastic moduli E between 280 GPa and 320 GPa and densities $\rho$ between 2,900 kg/m³ and 3,500 kg/m³.

Silicon nitride is better than zirconia in terms of hardness and has the advantage that longer sample tubes can be made from it. Accordingly, if a sample tube made from silicon nitride and a sample tube made from zirconia are machined to the same length, the sample tube made from silicon nitride can better withstand rotation at higher speeds than the sample tube made from zirconia.

Silicon nitride contains silicon. Many silicon nitride materials contain aluminum as a sintering additive. Therefore, when an NMR measurement is made, a background arising from silicon or aluminum appears. Accordingly, sample tubes of silicon nitride are not well adapted for measurements of solid samples containing silicon or aluminum.

Examples of solid-state NMR measurements actually performed using a solid-state NMR sample tube associated with the present invention are next described.

For the measurements, a zirconia sample tube having an outside diameter of 1.0 mm and a length of 7.4 mm was used. Caps of Vespel (Trademark Registered) synthetic resinous material were mounted with a press fit in the openings at the opposite ends of the sample tube, sealing a sample. One radial bearing was disposed at each of the opposite ends of the sample tube. A thrust bearing was mounted on only one end of the sample tube. The sample tube was placed in position by utilizing negative pressure owing to the inertial force of fluid.

An impulse-type turbine made of a resinous cylindrical body of 1.0 mm having five blades cut therein was used to produce rotary force. The turbine was driven by ejecting an air jet at the blades. The sample tube was partially sputtered with gold. Light was made to hit the gold portion of the tube, and the period of the reflected light was measured. Thus, the rotational speed of the sample tube was detected.

Figure 7:
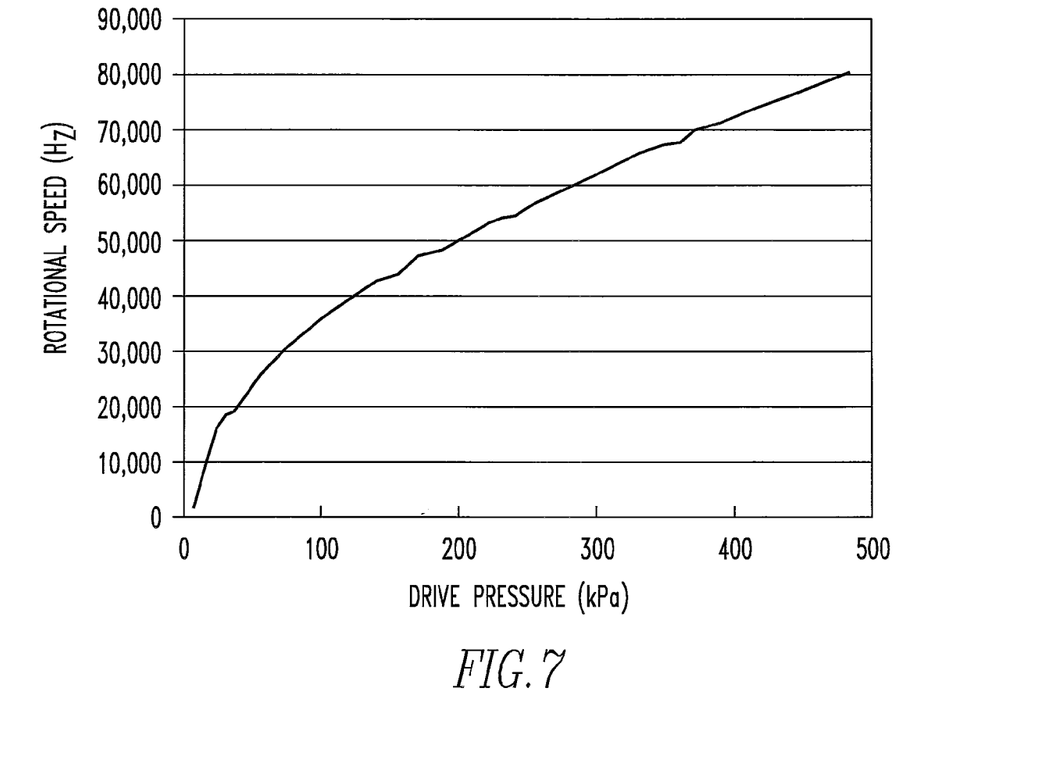
FIG. 7 is a graph showing the results of actual measurements of the rotational speed of a solid-state NMR sample tube associated with the invention.

FIG. 7 shows the relationship between the rotational speed of the sample tube and the pressure of the air jet. When the pressure of the driving jet was set to 480 kPa, a rotational speed of 80 kHz=4,800 krpm was achieved. A DN value (diameter (in mm)×rotational speed (in rpm)) providing an indication of the rotation capacity was recorded to be 4,800,000. Our experience shows that with the prior-art sample tubes, the rotational speed was increased to about 35 kHz at maximum. Therefore, the sample tube of the present invention exhibited a rotation capacity more than twice the rotational capacity achieved heretofore.

Figure 8:
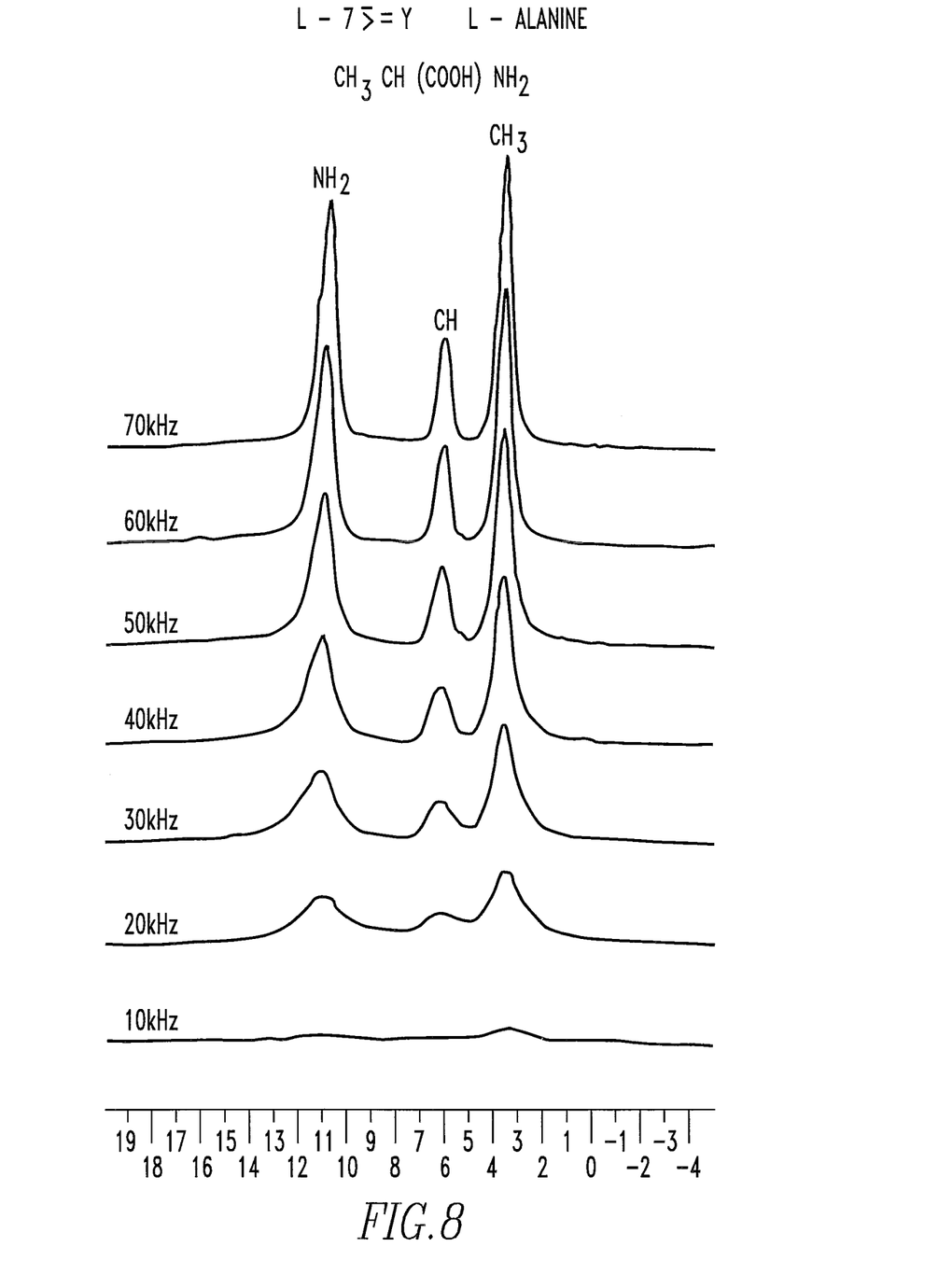
FIG. 8 shows NMR spectra of L-alanine obtained by the use of a solid-state NMR sample tube associated with the present invention.

FIG. 8 shows the results of solid-state $^1$H-NMR measurements of L-alanine (a kind of amino acid) performed using a solid-state NMR sample tube of the present invention. In the spectrum, the spectral peaks are assigned as proton of methyl group (—CH$_3$), proton of methine group (≡CH), and proton of amino group (—NH$_2$) in order from the right. The proton of carboxyl group (—COOH) is concealed by other signals and does not appear as an independent signal.

The spectral line width of L-alanine was broadened extremely by the very strong dipolar interaction of $^1$H-$^1$H. The line width could be sharpened by tilting the sample tube at the magic angle relative to the static magnetic field and spinning the tube at high speed (MAS). It is seen that a rise in the sensitivity to the spectral peaks was achieved.

Figure 9:
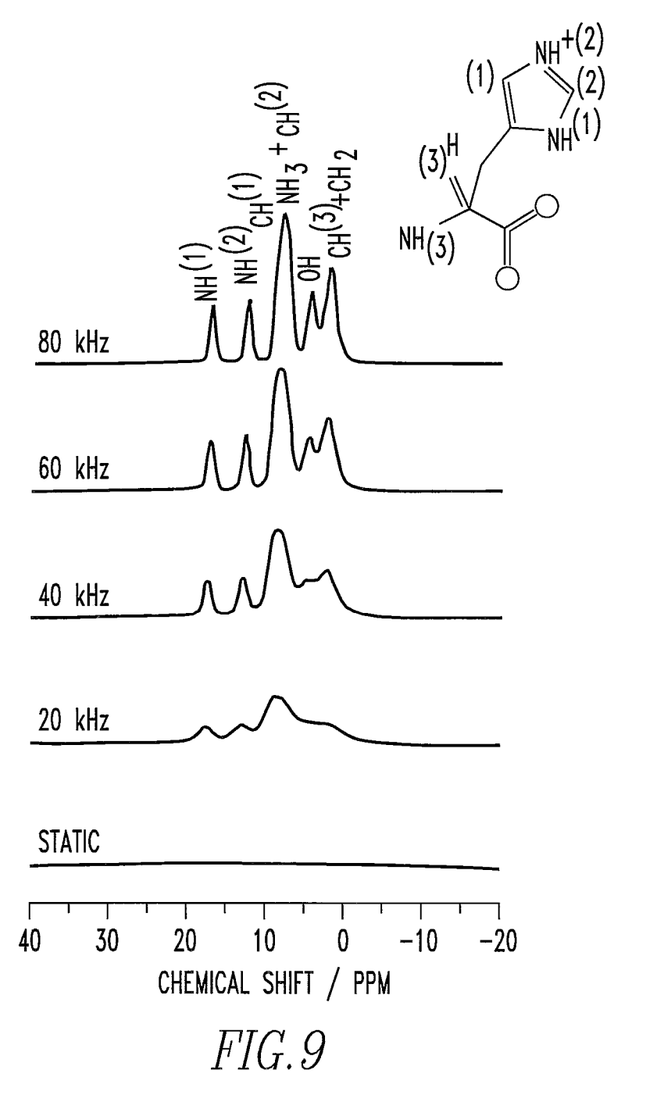
FIG. 9 shows NMR spectra of L-histidine chloride monohydrate obtained by the use of a solid-state NMR sample tube associated with the present invention.

FIG. 9 shows the results of $^1$H-NMR measurements of L-histidine chloride monohydrate (a kind of amino acid) performed using the solid-state NMR sample tube of the present invention. The five peaks in the spectrum are assigned, based on the molecular formula in the upper right portion of the figure, in order from the right as a first peak in which proton of methine group (≡CH$^{(3)}$) and proton of methylene group (≡CH$_2$) are overlapped, a second peak arising from the proton of hydroxyl group (—OH) of the water molecule of crystal water, a third peak in which the protons (CH$^{(1)}$ and CH$^{(2)}$) on the carbons of imidazole ring and the proton of amino group (—NH$_3^+$) are overlapped, a fourth peak arising from proton (NH$^{(2)}$) on the nitrogen of the imidazole ring, and a fifth peak arising from proton (NH$^{(1)}$) on the nitrogen on the imidazole ring (see, P. K. Madhu, E. Vinogradov, S. Vega, *Chemical Physics Letters*, vol. 394 (2004), pp. 423-428).

In the same way as in the case of L-alanine, the spectral line width of L-histidine chloride monohydrate that was broadened extremely by the very strong dipolar interaction of $^1$H-$^1$H could be sharpened by spinning the sample tube at high speed at the magic angle (MAS) to the static magnetic field. It can be seen that a rise in the sensitivity to spectral peaks could be achieved.

The present invention can find wide use in solid-state NMR spectral measurements.

Having thus described the invention with the detail and particularity required by the Patent Laws, what is desired protected by Letters Patent is set forth in the following claims.

The invention claimed is:

1. A solid-state NMR sample tube capable of sealing a sample, to be investigated by solid-state NMR spectroscopy, the sample tube being capable of being spun at high speed, where high speed is from a few kHz to tens of kHz, via gas bearings which are formed between the sample tube and a tube-holding mechanism that holds the tube by being supplied with a gas, said sample tube comprising:
    a hollow cylinder having opposite ends,
    at least one of the ends being open in order to form an opening; and
    a cover mounted in the opening,
        wherein the sample tube has a length L, an outside diameter D, and an inside diameter d which satisfy the following relationship:

$$(L/D) < \lambda \left(\frac{1}{8c}\right)^{1/2} \cdot \left(\left(1+\left(\frac{d}{D}\right)^2\right) \cdot \frac{E}{\rho}\right)^{1/4} \cdot B^{1/2} \quad (1)$$

where E is the longitudinal elastic modulus, ρ is the density, λ is 4.730, c is the sonic velocity (340 m/s), and B is a factor which is dependent on (L/D) and which is a value interpolated or extrapolated from each point in the following table:

| (L/D) | 3 | 4 | 5 | 6 | 7 | 8 | 10 | 20 |
|---|---|---|---|---|---|---|---|---|
| Bo | 0.77 | 0.84 | 0.89 | 0.91 | 0.93 | 0.95 | 0.97 | 0.99. |

2. The solid-state NMR sample tube of claim 1, wherein the ratio L/D has a value equal to or greater than 3.

3. The solid-state NMR sample tube of claim 1 or 2, wherein the longitudinal elastic modulus E of the hollow cylinder is between 190 GPa and 230 GPa and the density ρ is between 5,500 kg/m3 and 6,200 kg/m3 or the longitudinal elastic modulus E of the hollow cylinder is between 280 GPa and 320 GPa and the density ρ is between 2,900 kg/m3 and 3,500 kg/m3.

4. The solid-state NMR sample tube of claim 1 or 2, wherein the outside diameter D of the hollow cylinder is between 0.3 mm and 1.1 mm.

5. The solid-state NMR sample tube of claim 1 or 2, wherein the ratio (d/D) of the inside diameter d of the hollow cylinder to the outside diameter D is between 0.25 and 0.6.

6. The solid-state NMR sample tube of claim 1 or 2, wherein the cover mounted in the opening of the hollow cylinder is not greater in outside diameter than the hollow cylinder.

7. A solid-state NMR measurement method of making solid-state NMR spectral measurements using the solid-state NMR sample tube set forth in claim 1.

* * * * *